(12) United States Patent
Messina et al.

(10) Patent No.: US 7,447,283 B2
(45) Date of Patent: Nov. 4, 2008

(54) METHOD FOR AUTOMATIC GAIN CONTROL, FOR INSTANCE IN A TELECOMMUNICATION SYSTEM, DEVICE AND COMPUTER PROGRAM PRODUCT THEREFOR

(75) Inventors: Ettore Messina, Crozet (FR); Nicolò Ivan Piazzese, Acireale (IT); Giuseppe Lippolis, Putignano (IT); Elena Salurso, Agropoli (IT); Alberto Serratore, Gravina di Catania (IT); Agostino Galluzzo, Palma di Montechiaro (IT)

(73) Assignees: STMicroelectronics S.R.L., Agrate Brianza (MI) (IT); STMicroelectronics SA, Montrouge (FR)

( * ) Notice: Subject to any disclaimer, the term of this patent is extended or adjusted under 35 U.S.C. 154(b) by 647 days.

(21) Appl. No.: 10/888,088

(22) Filed: Jul. 9, 2004

(65) Prior Publication Data

US 2005/0031057 A1 Feb. 10, 2005

(30) Foreign Application Priority Data

Jul. 15, 2003 (EP) .................................. 03354064

(51) Int. Cl.
*H04L 27/08* (2006.01)
(52) U.S. Cl. ...................................... 375/345
(58) Field of Classification Search ................. 375/317, 375/319, 345; 455/232.1, 234.1, 239.1, 240.1
See application file for complete search history.

(56) References Cited

U.S. PATENT DOCUMENTS

| | | | | |
|---|---|---|---|---|
| 5,563,916 | A * | 10/1996 | Scarpa | 375/345 |
| 6,229,858 | B1 * | 5/2001 | Stephens et al. | 375/346 |
| 6,314,278 | B1 | 11/2001 | Zamat | 455/239.1 |
| 6,324,387 | B1 * | 11/2001 | Kamgar et al. | 455/234.1 |
| 6,668,027 | B1 * | 12/2003 | Scarpa | 375/345 |
| 6,744,838 | B1 * | 6/2004 | Dixit | 375/373 |
| 7,076,379 | B2 * | 7/2006 | Lee et al. | 702/75 |
| 2002/0187765 | A1 * | 12/2002 | Kozak et al. | 455/232.1 |

FOREIGN PATENT DOCUMENTS

GB 2123231 1/1984

\* cited by examiner

*Primary Examiner*—Khanh C Tran
(74) *Attorney, Agent, or Firm*—Lisa K. Jorgenson; Allen, Dyer, Doppelt, Milbrath & Gilchrist, P.A.

(57) ABSTRACT

A method for automatic gain control of an output signal generated from an input signal includes measuring power of the output signal. Measuring power of the output signal includes setting at least one power threshold, measuring a rate of crossing of the at least one power threshold by the output signal over an observation window, and deriving from the rate of crossing a measured power of the output signal. The method further includes providing a reference power, subtracting the measured power from the reference power to obtain an error signal, and mixing the input signal with the error signal. An analog-to-digital conversion is performed on a result of the mixing to obtain a gain-controlled output signal.

48 Claims, 4 Drawing Sheets

US 7,447,283 B2

METHOD FOR AUTOMATIC GAIN CONTROL, FOR INSTANCE IN A TELECOMMUNICATION SYSTEM, DEVICE AND COMPUTER PROGRAM PRODUCT THEREFOR

FIELD OF THE INVENTION

The present invention relates to techniques for automatic gain control (AGC), and more particularly, to an automatic gain control of signals received in a mobile telecommunication system.

Exemplary telecommunication systems are those systems based on the CDMA (Code Division Multiple Access) technique, and in the following, reference will primarily be made to CDMA systems. However, this is not to be construed in a limiting sense, and the present invention is applicable to a wide variety of telecommunication systems including but not limited to satellite telecommunications systems and terrestrial mobile telecommunication systems operating according to the GSM, UMTS, CDMA2000, IS95 and WBCDMA standards.

BACKGROUND OF THE INVENTION

In a mobile telecommunication system the received signal envelope may exhibit a very large dynamic range. A gain control is therefore required in the receiver to adjust the signal amplitude at the input of the analog-to-digital converter (ADC). The automatic gain control should control the signal amplitude to avoid or limit saturation of the analog-to-digital converter, and at the same time, ensure an efficient exploitation of the ADC dynamic range.

As reported in the standard technical literature, the AGC loop adjustment is based on the measurement of the received signal power. This measurement can be effected directly at the RF unit or after (i.e., downstream) the ADC. In a classical AGC implementation, the signal level is adjusted by multiplying the signal itself by a proper scale factor. This scale factor is calculated by measuring the received signal power over a certain interval.

In FIG. 1 a simplified block diagram of an AGC loop according to the prior art is shown. Such an AGC loop is designated by the reference numeral 10 and receives an input signal $S_{in}$, which corresponds to the received signal, as well as a reference digital signal $P_{ref}$ that is indicative of a reference power level.

The reference power signal $P_{ref}$ is fed to a summation node 11 along with a measured power signal $P_{meas}$. In the summation node 11 the measured power signal $P_{meas}$ is added with a negative sign (i.e., subtracted) from the reference digital power signal $P_{ref}$ to obtain an error signal $P_{err}$. The error signal $P_{err}$ is fed into a loop filter 12 with a transfer function F(z) that usually involves a FIR (Finite Impulse Response) filter, a gain factor and an integrator. The filter 12 produces a filtered error signal $P_f$, which is multiplied in a multiplying node 13 by the input signal $S_{in}$.

The output of the multiplying node 13 is sent to an analog-to-digital converter 14 that produces a digital output signal x(t) comprising a controlled output signal $S_{out}$ of the loop 10. The controlled output signal $S_{out}$ is also transmitted over a feedback branch back to the summing node 11. The feedback branch includes a power measurement block 15, which measures the power of the output signal $S_{out}$, thus generating the measured power signal $P_{meas}$ that is fed back to the summation node 11. The power measurement block 15 usually performs squaring and averaging operations over a certain time interval of the controlled output signal $S_{out}$ to obtain the above mentioned scale factor for multiplying the input signal $S_{in}$.

The reference digital power signal $P_{ref}$ can be regarded as a steady state signal exempt from disturbances, whereas the power variations of the input signal $S_{in}$ can be regarded as a source of disturbances. The loop shown in FIG. 1 performs a direct measurement of the power of the received signal. Such a direct measurement is, however, quite expensive in terms of required hardware resources and power consumption involved.

SUMMARY OF THE INVENTION

An object of the present invention is to provide an arrangement that reduces the cost of the hardware resources required for automatic gain control and the power consumption at the receiver.

According to the present invention, this object is achieved by a method for the automatic gain control in telecommunication systems having the characteristics set forth in the claims that follow. The invention also relates to a corresponding receiver, as well as to a computer program product directly loadable in the memory of a digital computer and comprising software code portions for performing the method when the product is run on a computer.

Substantially, the present invention provides for an indirect estimation of the power of the received signal, which is obtained through the measurement of a threshold crossing rate of the received signal. In comparison with prior art arrangements, the present invention reduces the hardware resource and the supply power requirements at the receiver.

BRIEF DESCRIPTION OF THE DRAWINGS

The present invention will now be described, purely by way of a non-limiting example, with reference to the annexed drawings, wherein.

DETAILED DESCRIPTION OF THE PREFERRED EMBODIMENTS

The basic idea underlying the arrangement described herein is to measure over a given observation window the number of times the absolute value of the signal at the output of the analog-to-digital converter is above a certain threshold. Such a measurement provides an indirect estimate of the power of the received signal, which is then compared to a reference value (power set-point) to obtain the loop error signal. The error signal, properly scaled and filtered, is used to drive a variable gain amplifier to control the amplitude of the signal at the input of the analog-to-digital converter. The variable gain amplifier has an exponential characteristic.

Figure 1:
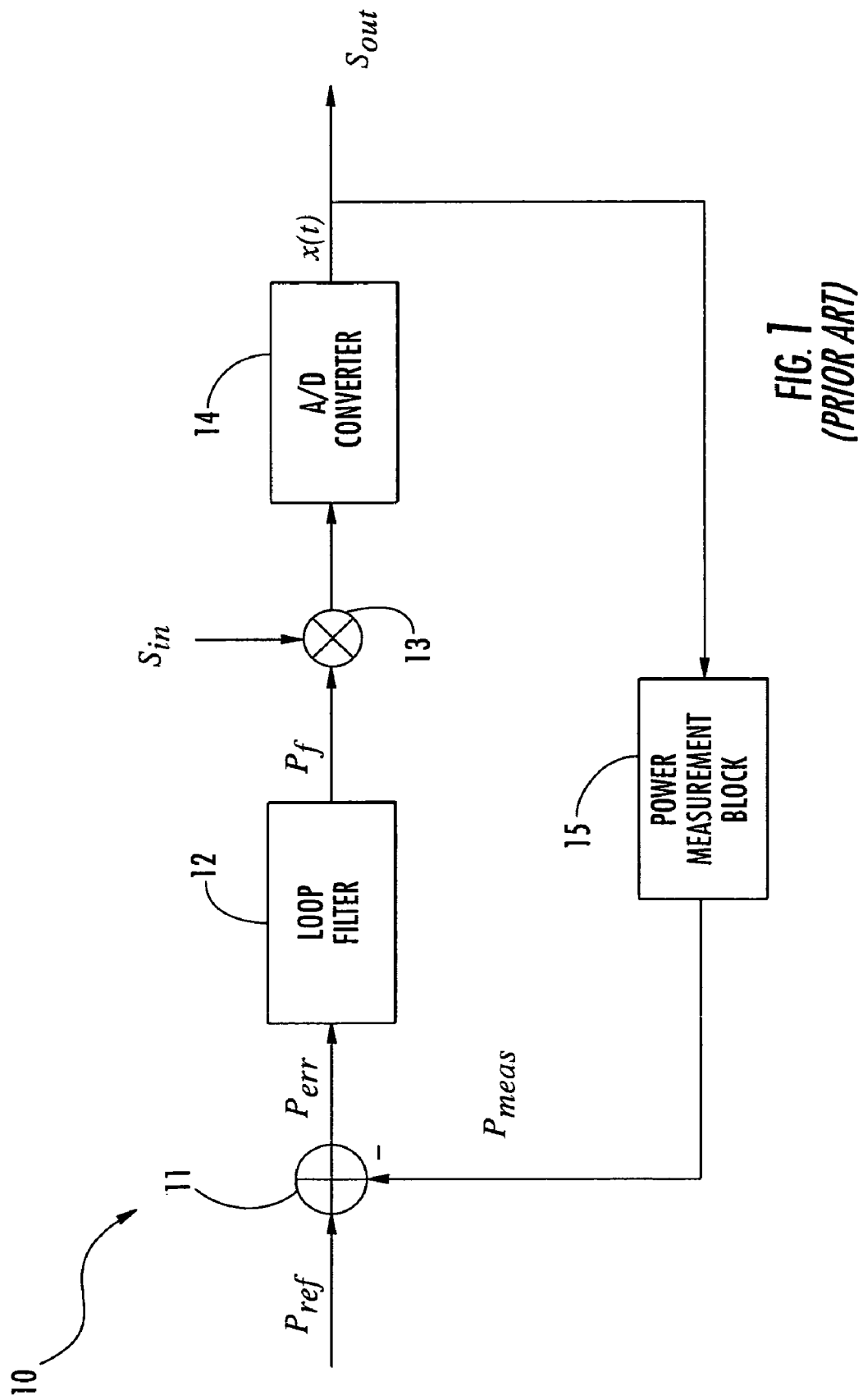
FIG. 1 is a block diagram of a receiver adapted for implementing an automatic gain control according to the prior art.
Figure 2:
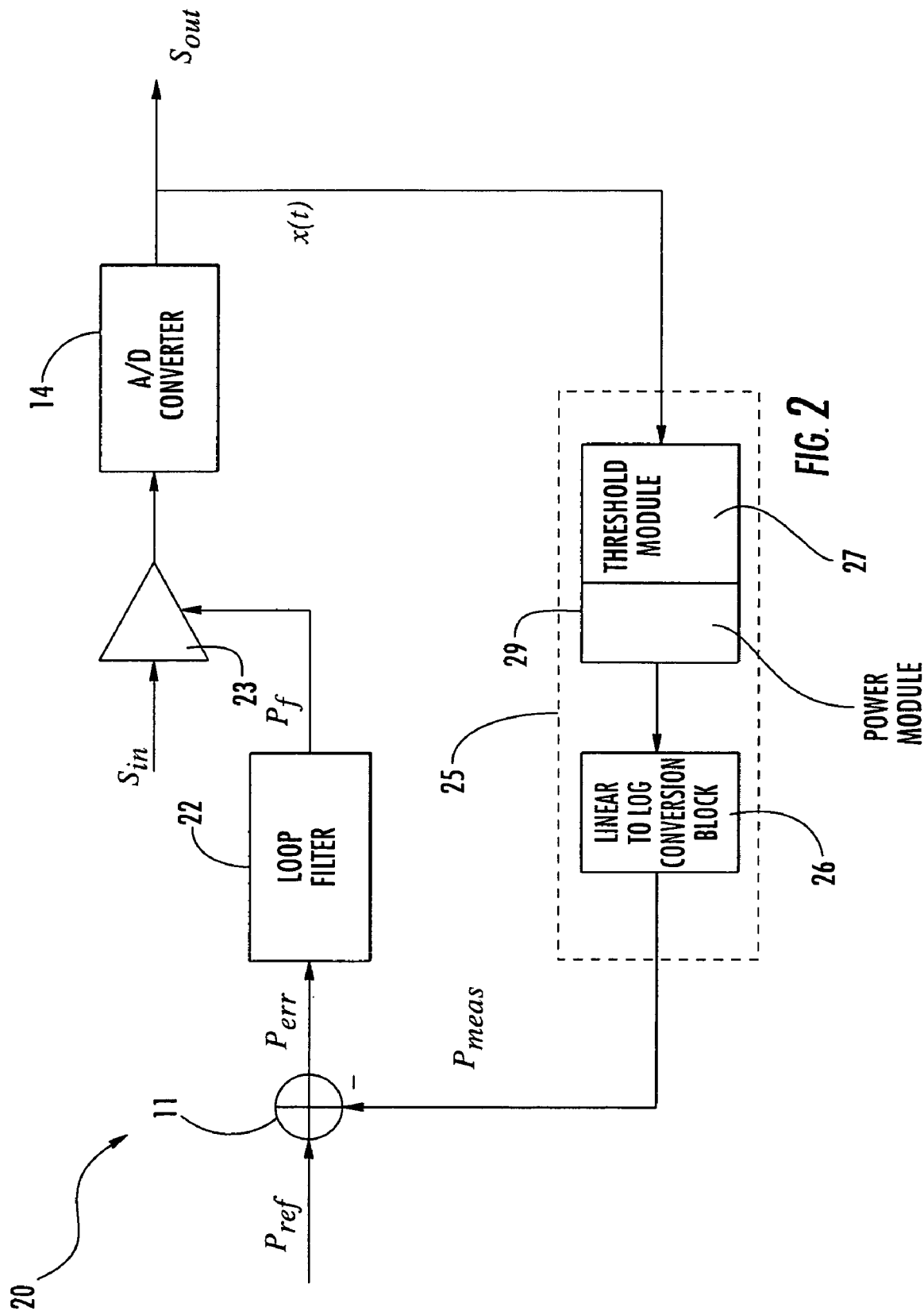
FIG. 2 is a block diagram of a receiver adapted for implementing an automatic gain control according to the present invention.

In FIG. 2, the blocks and elements that perform the same functions as those included in the AGC loop 10 described with reference to FIG. 1 are indicated by the same reference numbers. The illustrated AGC loop 20 receives at its two inputs the input signal $S_{in}$ that corresponds to the received signal, and the reference power value Pref that is preferably expressed in dB.

The reference digital power signal $P_{ref}$ is fed to the summation node 11 along with the measured power signal $P_{meas}$. In the summation node 11 the measured power signal $P_{meas}$ is subtracted from the reference digital power signal $P_{ref}$ to obtain the error signal $P_{err}$. The error signal $P_{err}$ is then fed into a loop filter 22. The filtered error signal $P_f$ from the loop filter 22 is sent as a control signal to a variable gain amplifier 23 that receives at its input the input signal $S_{in}$.

The gain of the variable gain amplifier 23 is thus set by the value of the filtered error signal $P_f$. The output of the variable gain amplifier 23 is then sent to the analog-to-digital converter 14 that supplies the controlled output signal $S_{out}$ to the output of the AGC loop 20 and to the feedback branch.

The feedback branch comprises a power measurement block 25. This in turn includes a module 27 for estimating the threshold crossing rate of the power of the controlled output signal $S_{out}$. The module 27 is associated with a module for calculating the power value from the threshold crossing rate, indicated by reference 29. Downstream of the module 29, a linear-to-logarithm (dB) conversion block 26 is arranged to ensure a uniform behavior over a large operating range.

As previously indicated, x(t) denotes the digital output process of the analog-to-digital converter 14, and is then defined as a discrete random variable:

$$\beta = \begin{cases} 0 & x(t) \leq T_h \\ 1 & x(t) > T_h \end{cases} \quad (1)$$

$T_h$ indicates a power threshold value.

Thus, the values of the variable β are representative of the crossings of the threshold $T_h$ by the signal x(t) at the output of the analog-to-digital converter 14. The overflow probability P, i.e., the probability for the variable β to be equal to 1, which means an overflow of the analog-to-digital converter 14 with respect to the threshold $T_h$, can be expressed as:

$$P(\beta = 1) = erfc\left(\frac{T_h}{\sqrt{2\sigma^2}}\right) \quad (2)$$

where $\sigma^2$ indicates the variance (i.e., the power) of the signal x(t).

Indicating with E(β) the statistical expectation of the variable β, i.e.,:

$$E(\beta) = erfc\left(\frac{T_h}{\sqrt{2\sigma^2}}\right) \quad (3)$$

the variance $\sigma^2$ can be obtained by the measurement of the expectation E(β).

This operation can be implemented by accumulating over a given time window a number N of values of the variable β in the module 27 for estimating the threshold crossing rate. An estimator indicated by χ is thus obtained that substantially represents the crossing rate in the chosen observation window:

$$\chi = \frac{1}{N}\sum_{i=1}^{N}\beta \quad (4)$$

The statistical expectation E(χ) of the estimator χ is:

$$\begin{aligned} E(\chi) &= \frac{1}{N}\sum_{i=1}^{N} E(\beta) \\ &= E(\beta) \\ &= erfc\left(\frac{T_h}{\sqrt{2\sigma^2}}\right) \\ &= f_{single}(\sigma^2) \end{aligned} \quad (5)$$

where $f_{single}$ indicates a single threshold function binding the variance $\sigma^2$ to the estimator χ, as opposed to a multi-threshold function $f_{Multi}$ that will be described below.

Thus, inversion of the single level function $f_{single}$, (i.e., inverting the complementary error function erfc), yields:

$$\hat{\sigma}^2 = f_{single}^{-1}(\chi) = \frac{1}{2}\left(\frac{T_h}{ierfc(E(\chi))}\right) \quad (6)$$

$\sigma^2$ corresponds to the measurement of the power of the signal x(t).

Due to the range of expectation E(χ), namely [0,1] being the same as the input value of the inverse error function ierfc in the power measure block 25, the function ierfc(E(χ)) can be obtained simply by a look up table (LUT) without having to perform a difficult analytical or numerical calculation. This will be shown with reference to FIG. 3, and results in a small number of values within a small, limited range. The look up table also takes into account the squaring and division operations required by equation (6).

The final behavior of the AGC loop 20 depends on the actual setting of a number of parameters, in particular, parameters like the digital reference power $P_{ref}$, the power threshold $T_h$ used for the crossing-rate measurement, a loop operating frequency $f_s$, and a loop gain $K_G$.

It can be demonstrated that the AGC loop 20 behaves essentially like a first order high-pass filter with a normalized cut-off frequency $f_{hp}$:

$$f_{hp} = \frac{1}{2\pi}\ln\left(\frac{1}{1 - K_G}\right) \quad (7)$$

Thus, by setting the loop gain $K_G$ value it is possible to obtain a given bandwidth. To set the digital reference power $P_{ref}$ level, the dynamic range of the analog-to-digital converter 14 should be taken into account.

In the embodiment described herein such a range is set to [−2, 2] and the analog-to-digital converter 14 has a unitary gain. This means that the output range will be in the interval [−2, 2] with a fractional quantization step depending on the word size. An acceptable value for the saturation rate of the ADC is about 5%, which corresponds to a variance $\sigma^2=1$, as it can be derived from equation 3. The value selected for the digital reference power is then $P_{ref}=0$ dB (on each component). However, fine tuning may be needed to optimize performance in a number of different fading conditions.

The center point of the single side dynamic range, i.e., for a threshold value $T_h=1$, is chosen as the value of the threshold. The loop operating frequency $f_s$ is chosen equal to 1.5 KHz (i.e., the slot rate of the received signal in the UMTS/WCDMA standard). As shown above, the frequency response of a first order loop is already quite satisfactory. For this reason no additional loop filters have been introduced.

The AGC loop 20 is actually required to compensate only power variations of the received signal due to slow fading. Consequently, the loop bandwidth is set to 15 Hz which corresponds to a loop gain $K_G$ value of 0.07 (eq. 7). In this way, for the chosen value of the loop gain $K_G$, the oscillations of the input power, in dB, are reduced by a factor of about $9\times10^{-2}$ at a frequency $f_s*10^{-3}$ (1.5 Hz @ $f_s=1.5$ KHz) and by a factor of about $7\times10^{-1}$ at a frequency $f_s*10^{-2}$ (15 Hz @ $f_s=1.5$ KHz).

Figure 3:
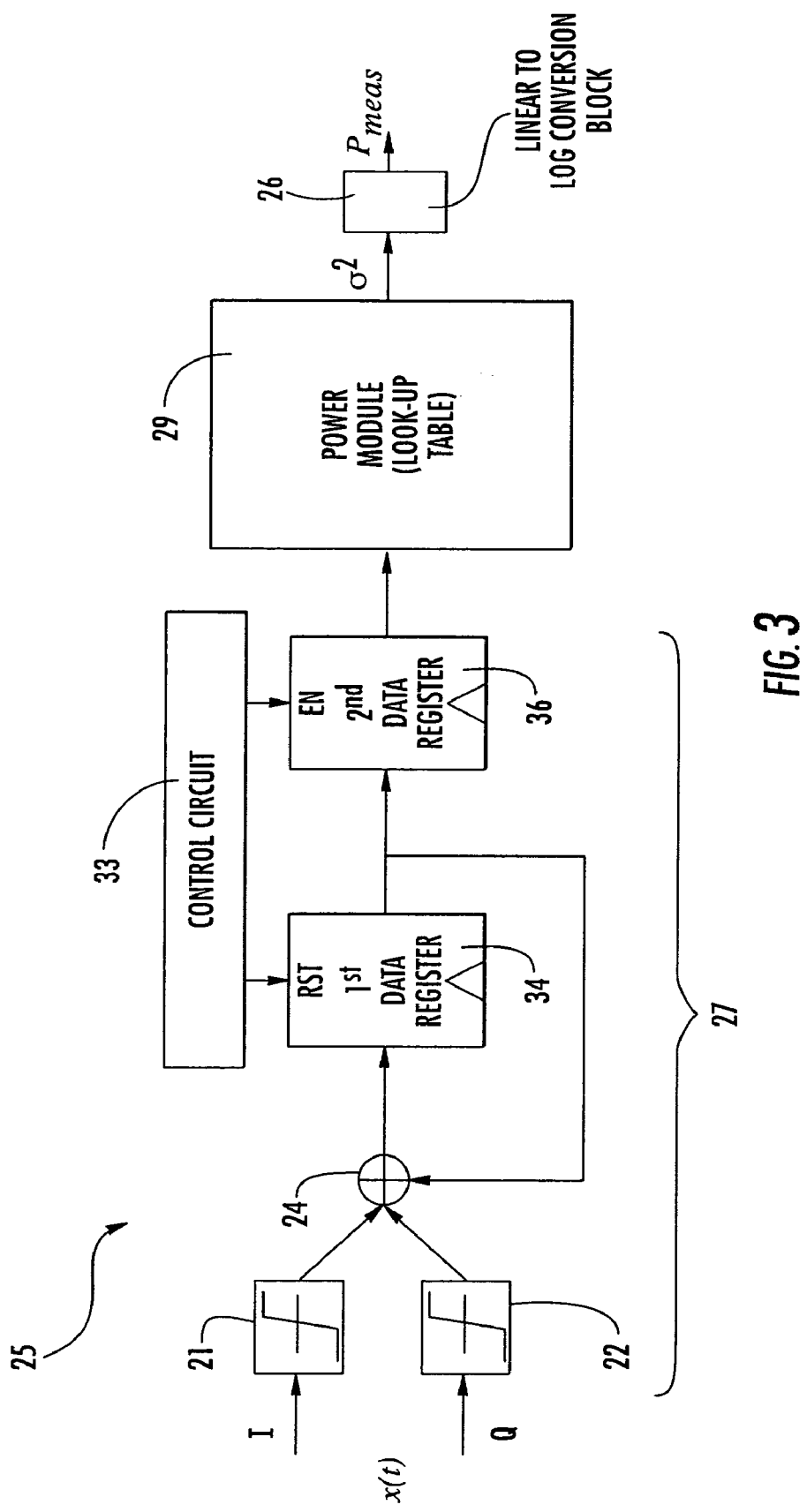
FIG. 3 schematically illustrates in greater detail the power measurement block as shown in FIG. 2.

The AGC loop 20 is able to significantly compensate the slow power variations over the channel, and is almost not sensitive to fast variations. In FIG. 3 an embodiment of the power measurement block 25 is shown. The digital output signal x(t) from the analog-to-digital converter 14 is input to the module 27 for estimating the threshold crossing rate. Specifically, this is done via two threshold comparators 21 and 22, operating on the I-channel and the Q-channel of the output signal x(t), respectively.

The results of the two comparisons performed at the threshold comparators 21 and 22 are then summed in a summation node 24. To accumulate over the chosen observation window, i.e., N times, the results from the comparators 21 and 22 that implement equation (4), a logic circuit is provided downstream of the summation node 24. This logic circuit includes a first data register 34 followed by a second data register 36. A control circuit 33 controls a reset input RST of the first data register 34 and an enable input EN of the second data register 36. The output of the data register 34 is fed to the data register 36 and to the summing node 24. This is done to accumulate the values of the variable β up to the moment the control circuit 33 enables feeding the accumulated value through the data register 36 to a look up table that embodies the module for calculating the power value from the threshold crossing rate 29.

The logic circuit also performs under the control of the control circuit 33 a division by 2N, to evaluate the crossing rate or the estimator. Such a look up table 29 contains the values of the inverse of function $f_{single}$. The threshold crossing rate is used to extract from the look up table 29 the value of the relative estimated power expressed in dB.

The observation window may be chosen to be equal to 38400 for example, and the threshold $T_h$ set to half of the single-sided output range of the analog-to-digital converter 14. Such a choice of the threshold value has the additional advantage of requiring a very simple comparator since only the 2 most significant bits of the digital output x(t) are required to detect the threshold crossing event.

Figure 4:
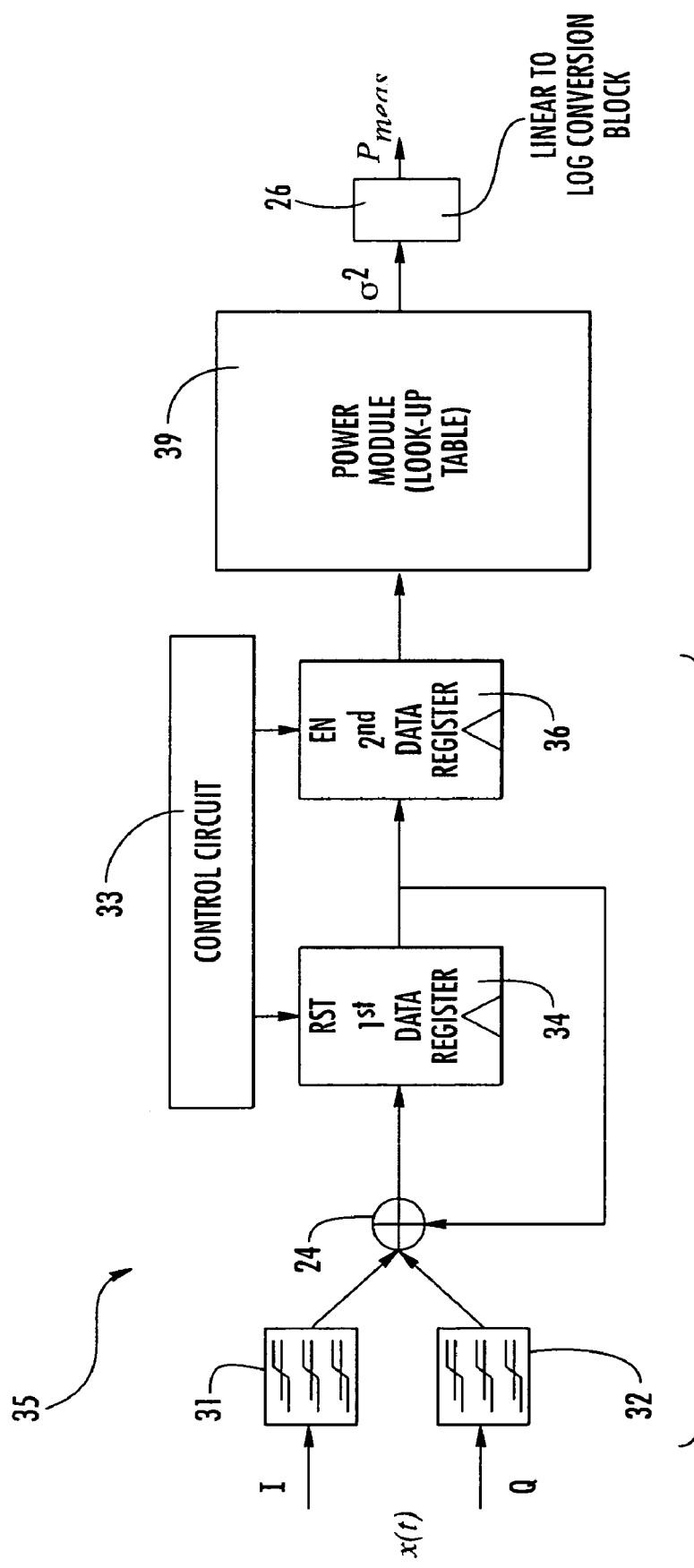
FIG. 4 schematically details an alternative embodiment of the power measurement block circuit as shown in FIG. 3.

The accumulation result may be mapped onto the power values in the look up table 29 differently according to the degree of accuracy selected. In a simple case (uniform quantization with 75 points), the result of the accumulation is divided by 1024. In this way, at the input of the look up table 29 an integer value in the range [0, 75] is obtained. For each one of these values the estimated power is given as the output. For a more efficient implementation, the conversion to the logarithmic domain can be included in the look-up-table in such a way that the look-up table 29 and the a linear-to-logarithmic conversion block 26 results in a single physical component In an alternative embodiment, as shown in FIG. 4, multiple threshold comparisons can be adopted, to improve performance in terms of estimation mean square error. This can be obtained by adding a moderate amount of complexity to the basic circuitry.

In the following the case is detailed of three thresholds of increasing values $T_{h1}$, $T_{h2}$, $T_{h3}$. Those of skill in the art will promptly appreciate that the thresholds may in fact be any number. The discrete variable β is defined as:

$$\beta = \begin{cases} 0 & x(t) \leq T_{h1} \\ 1 & T_{h1} < x(t) \leq T_{h2} \\ 2 & T_{h2} < x(t) \leq T_{h3} \\ 3 & T_{h3} < x(t) \end{cases} \quad (8)$$

Overflow probabilities with respect to each of the three thresholds, $T_{h1}$, $T_{h2}$, $T_{h3}$ can be easily obtained by applying equation (2).

In this case, the statistical expectation E (β) corresponds to the multilevel function $f_{Multi}$:

$$E(\beta) = \sum_{i=1}^{3} erfc\left(\frac{T_{hi}}{\sqrt{2\sigma^2}}\right) = f_{Multi}(\sigma^2) \quad (9)$$

By applying the same procedure already described for the single threshold method, an accumulation of N values of the variable β, E(χ) is obtained as:

$$E(\chi) = \frac{1}{N}\sum_{i=1}^{N} E(\beta) = E(\beta) = f_{Multi}(\sigma^2) \quad (10)$$

and, using χ as an estimator of $\sigma^2$:

$$\sigma^2 = f_{Multi}^{-1}(E(\chi)) \quad (12)$$

This is implemented through a power measurement block 35, as shown in FIG. 4. The power measurement block 35 comprises a module for estimating the threshold crossing rate 37 by using two multilevel comparators 31 and 32 for the I channel and the Q channel of the signal x(t), respectively.

The power measurement block 35 is then substantially identical to the block 25 for the single threshold method shown in FIG. 3, with the exception of a look up table 39 that implements the inverse of multi-threshold function $f_{Multi}$ from equation (12). However, the look up table 39 has the same size as the look up table 29 for the single threshold.

The functions implemented in the look-up tables 29 and 39 are significantly non-linear. It is thus advisable to use a non-uniform quantization on the x axis to minimize hardware complexity. This may be done while applying a uniform quantization on the y axis.

The arrangements disclosed herein permit remarkable advantages to be obtained over the known approaches. Circuit complexity and hardware requirements at the receiver are significantly reduced due to absence of any multipliers. Savings on the order of 55% of the chip area in the single threshold case, and 30% in the multi-threshold case can be achieved in comparison with the conventional implementation, as shown for instance in FIG. 1. Such a reduction also involves a reduction in power consumption at the receiver.

Receivers implementing the automatic gain control method described exhibit undistorted estimation even in the presence of strong saturation at the output of the analog-to-digital converter. Without prejudice to the underlying principle of the invention, the details and embodiment may vary, also significantly, with respect to what has been discussed just by way of example without departing from the scope of the invention, and as defined by the claims that follow.

For instance, devices different from the illustrated variable gain amplifier may be used for mixing the received signal with the error signal in the AGC loop. Any device/circuit adapted to scale the received signal on the basis of a proportionality relationship to the error signal and/or the measured power may be used for that purpose.

The primary field of application of the arrangement disclosed herein are for devices where the gain of an incoming signal is to be controlled. A typical case is for receivers in mobile telecommunications systems, such as receivers for satellite and terrestrial mobile telecommunications systems according to the GSM, UMTS, CDMA2000, IS95 and WBCDMA standards, for example.

That which is claimed is:

1. A method for automatic gain control of an output signal generated from an input signal, the method comprising:
    measuring power of the output signal comprising
        setting at least one power threshold,
        measuring a rate of crossing of the at least one power threshold by the output signal over an observation window, and
        deriving from the rate of crossing a measured power of the output signal,
    providing a reference power,
    subtracting the measured power from the reference power to obtain an error signal,
    mixing the input signal with the error signal, and
    performing an analog-to-digital conversion on a result of the mixing to obtain a gain-controlled output signal.

2. A method of claim 1,
wherein deriving the measured power comprises:
    accumulating a number of the crossings of the at least one power threshold by the output signal; and
    calculating the rate of the crossings as a statistical expectation from the number of crossings.

3. A method of claim 2, wherein deriving the measured power further comprises applying at least one threshold function to the statistical expectation to obtain the measured power.

4. A method of claim 3, wherein the at least one threshold function comprises an inverse error function.

5. A method of claim 3, further comprising setting multiple thresholds and applying a multi-threshold function to the statistical expectation to obtain the measured power.

6. A method of claim 3, wherein the at least one threshold function is evaluated by retrieving values in a look up table.

7. A method of claim 1, further comprising filtering the error signal through a loop filter prior to being mixed with the input signal.

8. A method of claim 1, wherein mixing the error signal with the input signal is performed by amplifying the input signal with a variable gain function of the error signal.

9. A method according to claim 1, further comprising converting the measured power of the output signal from a linear value to a logarithmic value.

10. A method according to claim 1, wherein the input signal is received by a telecommunications system.

11. An automatic gain control device for providing a gain-controlled output signal from an input signal, the automatic gain control device comprising:
    a power measurement module for measuring power of the output signal and comprising
        at least one threshold module for measuring a rate of crossing of at least one power threshold by the output signal over an observation window, said at least one threshold module comprising an accumulator for accumulating a number of crossings of at least one power threshold by the output signal, and for measuring the rate of the crossings as a statistical expectation from the number of crossings, and
        at least one power module for deriving from the rate of crossing a measured power.

12. An automatic gain control device of claim 11, further comprising:
    a summing node for subtracting the measured power from a reference power to obtain an error signal;
    a mixer node for mixing the input signal with the error signal; and
    an analog-to-digital converter for converting a result of the mixing to obtain the gain-controlled output signal.

13. An automatic gain control device of claim 12, further comprising a loop filter for filtering the error signal prior to mixing the filtered error signal with the input signal.

14. An automatic gain control device of claim 12, wherein said mixer node mixes the error signal with the input signal by amplifying the input signal with 15. An automatic gain control device of claim 11, wherein said at least one threshold module comprises at least one threshold comparator for applying a threshold function to the statistical expectation to obtain the measured power.

16. An automatic gain control device of claim 15, wherein said at least one threshold comparator implements the threshold function as an inverse error function.

17. An automatic gain control device of claim 15, wherein said at least one threshold module comprises a plurality of threshold comparators for applying a multi-threshold function to the statistical expectation to obtain the measured power.

18. An automatic gain control device of claim 17, wherein said at least one power module includes a look up table containing values for the multi-threshold function. a variable gain function of the error signal.

19. An automatic gain control device of claim 11, further comprising a linear-to-logarithmic converter for converting the measured power from a linear value to a logarithmic value.

20. A receiver for a telecommunications system comprising:
    an input for receiving an input signal; and
    an automatic gain control device downstream from said input for providing a gain-controlled output signal from the input signal, said automatic gain control device comprising
        a threshold module for measuring a rate of crossing of at least one power threshold by the output signal over an observation window,
        a power module for deriving from the rate of crossing a measured power of the output signal,
        a summing node for subtracting the measured power from a reference power to obtain an error signal,
        a mixer node for mixing the input signal with the error signal, and an analog-to-digital converter for converting a result of the mixing to obtain a gain-controlled output signal.

21. A receiver of claim 20, wherein said threshold module comprises an accumulator for accumulating a number of crossings of at least one power threshold by the output signal, and for measuring the rate of the crossings as a statistical expectation from the number of crossings.

22. A receiver of claim 21, wherein said threshold module comprises at least one threshold comparator for applying a threshold function to the statistical expectation to obtain the measured power.

23. A receiver of claim 22, wherein said at least one threshold comparator implements the threshold function as an inverse error function.

24. A receiver of claim 22, wherein said threshold module comprises a plurality of threshold comparators for applying a multithreshold function to the statistical expectation to obtain the measured power.

25. A receiver of claim 22, wherein said power module includes a look up table containing values for the multithreshold function.

26. A receiver of claim 20, further comprising a loop filter for filtering the error signal prior to mixing the filtered error signal with the input signal.

27. A receiver of claim 20, wherein said mixer node mixes the error signal with the input signal by amplifying the input signal with a variable gain function of the error signal.

28. A receiver of claim 20, wherein the input signal is based upon at least one of the following GSM, UMTS, CDMA2000, 1395 and WBCDMA standards.

29. A computer-readable medium for automatic gain control of an output signal generated from an input signal, the computer-readable medium having computer-executable instructions for causing a user computer to perform steps comprising:
   setting at least one power threshold;
   measuring a rate of crossing of the at least one power threshold by an output signal over an observation window; and
   deriving from the rate of crossing a measured power of the output signal;
   subtracting the measured power from a reference power to obtain an error signal;
   mixing the input signal with the error signal; and
   performing an analog-to-digital conversion on a result of the mixing to obtain a gain-controlled output signal.

30. A computer-readable medium of claim 29, wherein containing data for deriving the measured power further comprises data for accumulating a number of the crossings of the at least one power threshold by the output signal; and calculating the rate of the crossings as a statistical expectation from the number of crossings.

31. A computer-readable medium of claim 30, wherein containing data for deriving the measured power further comprises data for applying at least one threshold function to the statistical expectation to obtain the measured power.

32. A computer-readable medium of claim 31, wherein containing data for deriving the measured power further comprises data for setting multiple thresholds and applying a multithreshold function to the statistical expectation to obtain the measured power.

33. A computer-readable medium of claim 31, wherein the at least one threshold function is evaluated by retrieving values in a look up table.

34. A computer-readable medium of claim 29 further having computer-executable instructions for causing the user computer to perform the following steps:
filtering the error signal through a loop filter prior to being mixed with the input signal.

35. A computer-readable medium of claim 29, wherein containing data for mixing the input signal with the error signal further comprises data so that mixing the error signal with the input signal is performed by amplifying the input signal with a variable gain function of the error signal.

36. A method for automatic gain control of an output signal generated from an input signal, the method comprising:
   measuring power of the output signal comprising
      setting at least one power threshold,
      measuring a rate of crossing of the at least one power threshold by the output signal over an observation window, and
      deriving from the rate of crossing a measured power of the output signal, the deriving comprising
         accumulating a number of the crossings of the at least one power threshold by the output signal,
         calculating the rate of the crossings as a statistical expectation from the number of crossings, and
         applying at least one threshold function to the statistical expectation to obtain the measured power.

37. A method of claim 36, further comprising:
   providing a reference power;
   subtracting the measured power from the reference power to obtain an error signal;
   mixing the input signal with the error signal; and
   performing an analog-to-digital conversion on a result of the mixing to obtain a gain-controlled output signal.

38. A method of claim 36, wherein the at least one threshold function comprises an inverse error function.

39. A method of claim 36, further comprising setting multiple thresholds and applying a multithreshold function to the statistical expectation to obtain the measured power.

40. A method of claim 36, wherein the at least one threshold function is evaluated by retrieving values in a look up table.

41. A method according to claim 36, further comprising converting the measured power of the output signal from a linear value to a logarithmic value.

42. A method according to claim 36, wherein the input signal is received by a telecommunications system.

43. An automatic gain control device for providing a gain-controlled output signal from an input signal, the automatic gain control device comprising:
   a power measurement module for measuring power of the output signal and comprising
      at least one threshold module for measuring a rate of crossing of at least one power threshold by the output signal over an observation window, and comprising
         an accumulator for accumulating a number of crossings of said at least one power threshold by the output signal, and for measuring the rate of the crossings as a statistical expectation from the number of crossings, and
         at least one threshold comparator for applying a threshold function to the statistical expectation to obtain the measured power.

44. An automatic gain control device of claim 43, further comprising:
   a summing node for subtracting the measured power from a reference power to obtain an error signal;
   a mixer node for mixing the input signal with the error signal; and
   an analog-to-digital converter for converting a result of the mixing to obtain the gain-controlled output signal.

45. An automatic gain control device of claim 43, wherein said at least one threshold comparator implements the threshold function as an inverse error function.

46. An automatic gain control device of claim 43, wherein said at least one threshold module comprises a plurality of threshold comparators for applying a multi-threshold function to the statistical expectation to obtain the measured power.

47. An automatic gain control device of claim 46, wherein said at least one power module includes a look up table containing values for the multi-threshold function.

48. An automatic gain control device of claim 43, further comprising a linear-to-logarithmic converter for converting the measured power from a linear value to a logarithmic value.

* * * * *

UNITED STATES PATENT AND TRADEMARK OFFICE
CERTIFICATE OF CORRECTION

PATENT NO. : 7,447,283 B2  Page 1 of 1
APPLICATION NO. : 10/888088
DATED : November 4, 2008
INVENTOR(S) : Ettore Messina et al.

It is certified that error appears in the above-identified patent and that said Letters Patent is hereby corrected as shown below:

| | |
|---|---|
| On the title page, Item [73]: Assignee | Delete: "S.R.L." Insert: --S.r.l.-- |
| Column 4, Line 32 | Delete: "$\sigma^2$" Insert: --$\hat{\sigma}^2$-- |
| Column 6, Line 1 | Delete: "the a linear" Insert: --the linear-- |
| Column 6, Line 3 | Delete: "component" Insert: --component.-- |
| Column 6, Line 10 | Delete: "$T_{h3}$," Insert: --$T_{h3}$-- |
| Column 7, Line 32 | Delete: "window, and" Insert: --window,-- |
| Column 8, Line 31 | Delete: "with" Insert: --with a variable gain function of the error signal.-- |
| Column 8, Line 46-47 | Delete: "function. a variable gain function of the error signal." Insert: --function.-- |
| Column 9, Line 17 | Delete: "multithreshold" Insert: --multi-threshold-- |

Signed and Sealed this

Eighth Day of June, 2010

David J. Kappos
*Director of the United States Patent and Trademark Office*